US012805324B2

(12) United States Patent
Liu et al.

(10) Patent No.: US 12,805,324 B2
(45) Date of Patent: Nov. 17, 2026

(54) PROTECTION DAM FOR A POWER MODULE WITH SPACERS

(71) Applicant: SEMICONDUCTOR COMPONENTS INDUSTRIES, LLC, Phoenix, AZ (US)

(72) Inventors: Yong Liu, Cumberland Foreside, ME (US); Liangbiao Chen, Scarborough, ME (US); Yusheng Lin, Phoenix, AZ (US); Chee Hiong Chew, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 514 days.

(21) Appl. No.: 18/172,904

(22) Filed: Feb. 22, 2023

(65) Prior Publication Data

US 2024/0282668 A1 Aug. 22, 2024

(51) Int. Cl.
*H10W 40/77* (2026.01)
*H10W 40/00* (2026.01)
(Continued)

(52) U.S. Cl.
CPC ....... *H10W 40/778* (2026.01); *H10W 40/037* (2026.01); *H10W 74/016* (2026.01); *H10W 74/111* (2026.01)

(58) Field of Classification Search
CPC ............. H01L 23/4334; H01L 21/4882; H01L 21/565; H01L 23/3107; H01L 23/16;
(Continued)

(56) References Cited

U.S. PATENT DOCUMENTS 5,227,663 A * 7/1993 Patil ........................ H05K 3/303 257/796
5,864,092 A * 1/1999 Gore ................. H01L 23/49805 174/557
(Continued)

OTHER PUBLICATIONS

Annex to Form PCT/ISA/206, Communication Relating to the Results of the Partial International Search Report, for counterpart International Application No. PCT/US2023/084322, mailed May 28, 2024, 16 pages.

(Continued)

*Primary Examiner* — Herve-Louis Y Assouman
(74) *Attorney, Agent, or Firm* — Brake Hughes Bellermann LLP

(57) ABSTRACT

A protective dam can relieve stress in a chip assembly of a high-power semiconductor device module used in electric vehicle or industrial applications. Some chip assemblies that incorporate copper spacers for thermal dissipation can cause the device module to become vulnerable to cracking. Adding a protective dam can absorb stress to prevent damage to materials surrounding the chip assembly. Various types of protective dams are presented, including high profile flexible protective dams, low profile flexible protective dams, metallic protective dams, and integral protective dams. The protective dams can be incorporated into a high-power semiconductor device module that features single sided or dual sided cooling via direct bond metal structures.

24 Claims, 10 Drawing Sheets

(51) Int. Cl.

| | |
|---|---|
| ***H10W 40/22*** | (2026.01) |
| ***H10W 40/25*** | (2026.01) |
| ***H10W 72/30*** | (2026.01) |
| ***H10W 74/01*** | (2026.01) |
| ***H10W 74/10*** | (2026.01) |
| ***H10W 74/47*** | (2026.01) |
| ***H10W 90/00*** | (2026.01) |
| ***H10W 90/20*** | (2026.01) |

(58) Field of Classification Search

CPC ............... H01L 23/3735; H01L 23/293; H01L 23/49575; H01L 23/49811; H01L 25/18; H01L 2224/26175; H01L 25/072; H01L 23/562; H10W 40/778; H10W 40/037; H10W 74/016; H10W 74/111; H10W 90/00; H10W 90/288; H10W 72/387; H10W 42/121; H10W 90/701; H10W 40/255; H10W 74/47; H10W 90/811; H10W 76/40; H10W 40/22

See application file for complete search history.

(56) References Cited

U.S. PATENT DOCUMENTS

| | | | | |
|---|---|---|---|---|
| 5,989,941 | A * | 11/1999 | Wensel | H01L 23/24 438/106 |
| 6,011,304 | A * | 1/2000 | Mertol | H01L 23/04 257/710 |
| 6,759,307 | B1 * | 7/2004 | Yang | H01L 24/48 29/841 |
| 7,019,395 | B2 | 3/2006 | Hirano et al. | |
| 8,441,123 | B1 * | 5/2013 | Lee | H01L 21/563 257/737 |
| 9,275,926 | B2 | 3/2016 | Hable et al. | |
| 9,390,996 | B2 | 7/2016 | Jeon | |
| 2004/0026778 | A1 * | 2/2004 | Grant | H01L 25/162 257/E25.031 |
| 2007/0222064 | A1 | 9/2007 | Edwards et al. | |
| 2011/0309488 | A1 | 12/2011 | Pagaila | |
| 2013/0009298 | A1 * | 1/2013 | Ota | H01L 25/072 977/773 |
| 2013/0147016 | A1 | 6/2013 | Hauenstein | |
| 2013/0270683 | A1 * | 10/2013 | Tsai | H01L 23/4334 438/122 |
| 2014/0252634 | A1 | 9/2014 | Hung | |
| 2015/0021754 | A1 | 1/2015 | Lin et al. | |
| 2015/0206864 | A1 | 7/2015 | Harazono | |
| 2017/0047261 | A1 * | 2/2017 | Lu | H01L 23/49816 |
| 2017/0141068 | A1 * | 5/2017 | Kadoguchi | H01L 24/32 |
| 2019/0019740 | A1 * | 1/2019 | Wu | H01L 23/49866 |
| 2020/0258824 | A1 * | 8/2020 | Maldo | H01L 23/3735 |
| 2021/0202357 | A1 * | 7/2021 | Poddar | H01L 23/49503 |
| 2021/0249329 | A1 * | 8/2021 | Chen | H10W 40/22 |
| 2023/0163100 | A1 * | 5/2023 | Sakuma | H10W 42/121 257/700 |

OTHER PUBLICATIONS

International Search Report and Written Opinion for counterpart International Application No. PCT/US2023/084322, mailed Jun. 25, 2024, 28 pages.

* cited by examiner

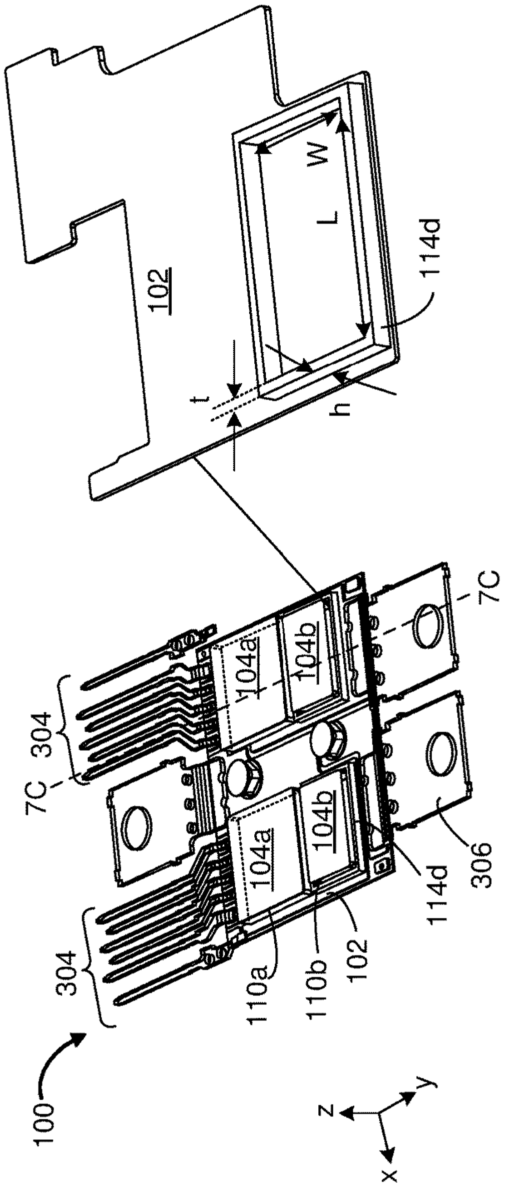
FIG. 7A
FIG. 7B
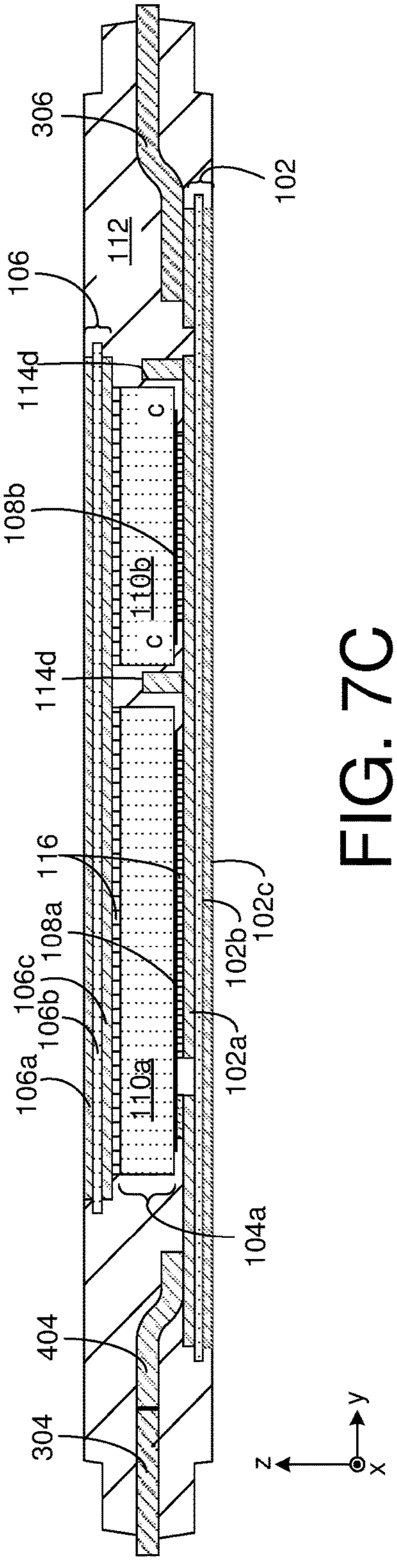
FIG. 7C

PROTECTION DAM FOR A POWER MODULE WITH SPACERS

TECHNICAL FIELD

This description relates to assembling and packaging semiconductor device modules, e.g., semiconductor device assemblies, semiconductor device module assemblies, etc. More specifically, this description relates to semiconductor device modules with improved thermal performance and mechanical stress reduction.

BACKGROUND

Semiconductor device modules, such as modules including power semiconductor devices, can be implemented using multiple semiconductor dies, multiple substrates (e.g., direct-bonded metal (DBM) substrates, die attach pads (DAPs)), electrical interconnections, and a molding compound. Power transistors can include, for example, insulated-gate bipolar transistors (IGBTs) or power metal-oxide-semiconductor field effect transistors (MOSFETs). Electrical interconnections within a high-power semiconductor device module can include, for example, bond wires, conductive spacers, and conductive clips. A polymer molding compound can serve as an encapsulant to protect components of the device assembly. Such power transistor devices can be used in various applications, including automotive and/or industrial applications.

SUMMARY

In some aspects, the techniques described herein relate to an apparatus, including: a substrate; a chip assembly coupled to the substrate where the chip assembly includes: a semiconductor die, a heat sink, and a molding material coupled to the heat sink; and a protection dam surrounding at least a portion of a perimeter of the chip assembly.

In some aspects, an apparatus includes a protection dam configured to absorb mechanical stress from expansion of the heat sink.

In some aspects, an apparatus includes a protection dam made of a flexible material.

In some aspects, an apparatus includes a protection dam that having a barrier configured to block a flow of solder.

In some aspects, an apparatus includes a protection dam that forms a seal against the substrate.

In some aspects, an apparatus includes a protection dam made of copper.

In some aspects, an apparatus includes a direct bonded metal (DBM) substrate, having a first metal layer, a second metal layer, and an insulating layer disposed between the first and second metal layers, the protection dam being a recessed copper layer integrated in the first metal layer.

In some aspects, an apparatus includes a first chip assembly and a second chip assembly coupled to the substrate, the protection dam encompassing both chip assemblies.

In some aspects, an apparatus includes a first chip assembly and a second chip assembly coupled to the substrate, the second chip assembly being disposed outside the protection dam.

In some aspects, an apparatus includes a semiconductor die coupled to the copper heat sink by a sintered layer of silver (Ag).

In some aspects, an apparatus includes a chip assembly that is a component of a high-power module configured for use in an automotive system.

In some aspects, an apparatus includes a substrate; a die assembly coupled to the substrate, the die assembly including copper components in contact with a polymer layer; and a protection dam disposed around the die assembly.

In some aspects, an apparatus includes a protection dam attached to the substrate.

In some aspects, an apparatus includes a protection dam integrated into the substrate.

In some aspects, an apparatus includes a protection dam that includes a recessed area of the substrate.

In some aspects, an apparatus includes a protection dam having an extension configured as a solder barrier.

In some aspects, the techniques described herein relate to a method that includes forming a chip assembly having a semiconductor die and a copper spacer; forming a protective dam around the chip assembly; coupling a substrate to a lead frame; coupling the chip assembly to the substrate; forming a direct bond metal (DBM) layer above the chip assembly; forming wire bonds to leads of the lead frame; and filling remaining space around the chip assembly with a molding compound.

In some aspects, forming the protective dam around the chip assembly includes attaching the protective dam to the substrate.

In some aspects, the protective dam is flexible and attaching the protective dam to the substrate includes applying pressure to the protective dam.

In some aspects, attaching the protective dam to the substrate includes applying an adhesive.

In some aspects, the protective dam is metallic and attaching the protective dam to the substrate includes soldering.

In some aspects, forming the protective dam includes forming a solder barrier integral to the protective dam.

In some aspects, the techniques described herein relate to a method that includes fabricating a chip assembly that includes a semiconductor die and a copper spacer; etching a recessed area in a surface metal layer of a substrate to form a protective dam; coupling the chip assembly to the substrate inside the protective dam; forming a direct bond metal (DBM) layer above the chip assembly; and filling remaining space around the chip assembly with a molding compound.

In some aspects, a method further includes coupling additional chip assemblies to the substrate, wherein etching the recessed area forms a protective dam around at least one of the additional chip assemblies.

BRIEF DESCRIPTION OF THE DRAWINGS

FIGS. 7A, 7B, and 7C show a top-side plan view, a magnified view, and a cross-sectional view, respectively, of a high-power semiconductor device module configured with an integral protective dam, according to an implementation of the present disclosure.

Figure 1:
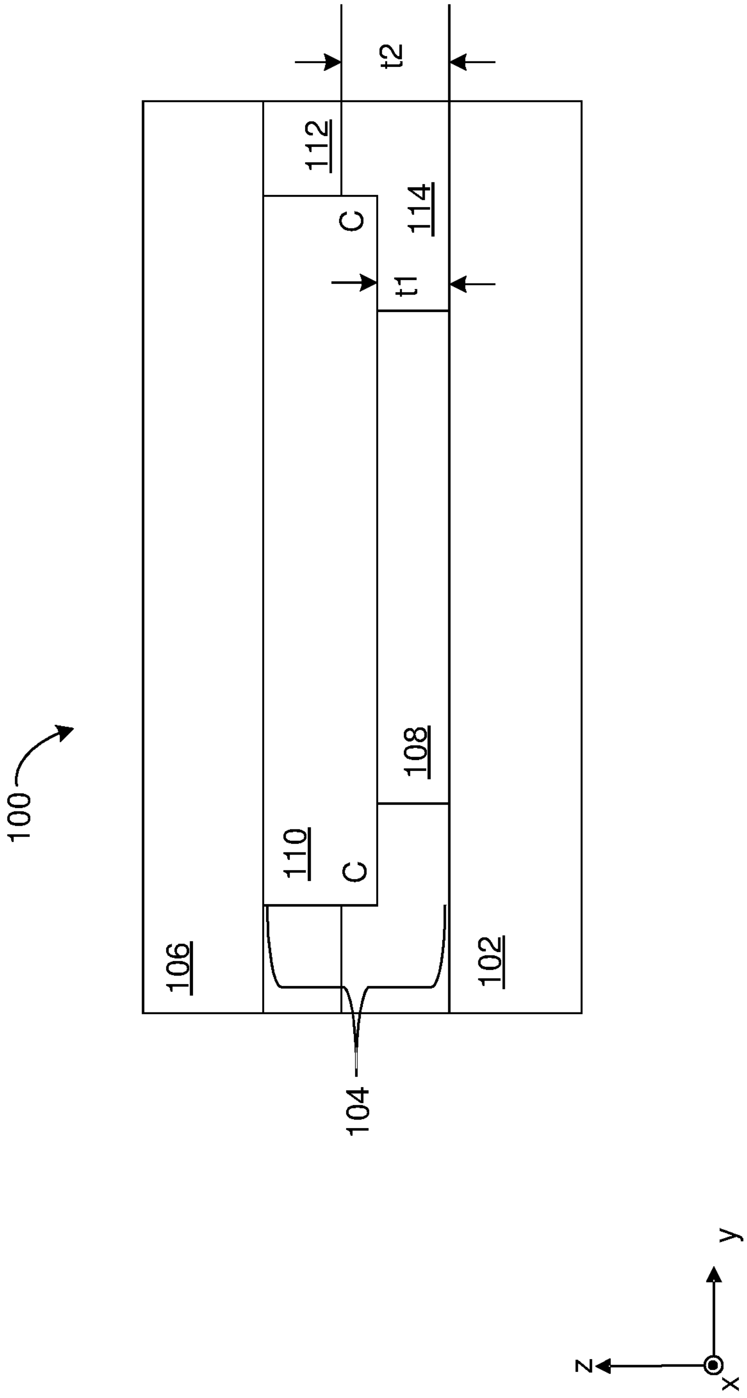
FIG. 1 is a high-level, simplified block diagram, shown in cross-section, that illustrates a high-power semiconductor device module, according to an implementation of the present disclosure.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

This disclosure relates to implementations of high-power semiconductor device assemblies and modules with improved thermal performance and reduced mechanical stresses.

In an assembly process for a semiconductor device module, a semiconductor die assembly, e.g., a chip assembly, including a semiconductor die containing one or more electronic devices, is first attached to a substrate. Contact or bond pads of the semiconductor die can then be attached by wire bonding to contact pads at ends of the leads of a lead frame. In some implementations, double sided cooling can be applied to the semiconductor die, in which case wire bonding may not be needed, After attaching the semiconductor die assembly, the lead frame is placed in a mold. The mold is provided with a reservoir for containing a quantity of an insulating molding compound. The molding compound is then injected into the mold to encapsulate the die attach pad(s) and the semiconductor die(s).

In some applications, power transistor devices can be used to implement electronic circuits, e.g., inverters or power amplifiers, used in automotive systems such as electrical vehicles (EVs) and/or hybrid electrical vehicles (HEVs). Such applications need reliable heat dissipation. Current implementations of semiconductor device assemblies including such power transistors (e.g., in combination with a fast recovery diode (FRD)) have certain drawbacks regarding thermal management. For example, some assemblies include heat sinks that alter the thermal profile of the assembly. Additionally, or alternatively, some implementations may only allow for cooling of the assembly, e.g., by attaching a thermal dissipation appliance, on a single side of the assembly. Such thermal imbalances can cause and/or exacerbate stresses between components within such an assembly, such as tensile stress and strain energy on the included semiconductor die, which can damage components of the assembly. As power requirements and associated operating temperatures for such devices increase, incidents of such damage may also increase.

In some implementations, a power transistor assembly can include, in proximity to the semiconductor die, a spacer that acts as a heat sink. In this context, the spacer dissipates heat produced by components on the die that operate at high voltages. Such spacers can be made of various materials, including ceramics, metals, and so forth. Spacers are one way to boost the thermal performance of a high-power semiconductor die. When copper components are used as heat sinks to dissipate heat within a chip assembly, or die assembly, rapid expansion of the copper can induce tensile stress in adjacent materials. Depending on the relative dimensions and material properties in the vicinity of the heat sink, the added stress may cause damage, e.g., cracks, dislocations, or fractures in the surrounding structure. Such damage may result in premature failure of devices within the chip assembly, poor thermal performance, or poor reliability.

This disclosure relates to implementations of high-power semiconductor device assemblies and modules with improved thermal performance and reduced mechanical stresses that address the issues described above. At least one solution is to introduce a protective element to relieve tensile stress in the structure around the copper spacers. Various types of protective elements are presented herein, in the form of flexible protective dams, metallic protective dams, and integral protective dams designed to surround one or more chip assemblies, within a power module, that experience a high degree of heat dissipation. In some implementations, the protective dam can be in contact with a lower surface of the chip assembly, and the protective dam may have walls that partially extend along sides of the chip assembly. In some implementations, the protective dam can be slightly spaced apart from the chip assembly.

FIG. 1 shows a simplified example of a high-power semiconductor device module 100, according to some implementations of the present disclosure. A more detailed illustration of the high-power semiconductor device module 100 is provided below in FIG. 2. In some implementations, the high-power semiconductor device module 100 includes, as fundamental elements, a substrate 102, one or more chip assemblies 104 (one shown), and an upper direct bond metal (DBM) structure 106. In some implementations, the substrate 102 can also include a lower DBM structure. In some implementations, the DBM structures are direct bond copper (DBC) type structures or direct bond aluminum (DBA) or direct plating copper (DPC) type structures. The DBM structure 106 can be designed as a three-layer structure that includes a large thermal mass, e.g., a dielectric, disposed between two outer metal layers to draw in and absorb heat. In some implementations, the thermal mass can provide electrical insulation. Use of both upper and lower DBM structures provides dual sided cooling for the chip assembly 104.

The chip assembly 104 includes at least one semiconductor die 108 and the spacer 110 in contact with the semiconductor die 108 to dissipate, e.g., rapidly dissipate,) heat generated therein. The chip assembly 104 is coupled to, e.g., mounted on, the substrate 102. In some implementations, the upper DBM structure 106 is a multi-layer structure formed on the spacer 110. In some implementations, the upper DBM structure 106 is larger than the spacer 110, which is, in turn, larger than the semiconductor die 108, thus creating a reverse pyramidal (as oriented in FIG. 1), or top-heavy, structure on the substrate 102. After constructing the chip assembly 104 and the DBM structure 106 on the substrate 102, remaining space around the chip assembly 104 can be filled with a molding compound 112.

The spacer 110, which serves as a heat sink, is made of a material having a high thermal conductivity such as, for example, copper or alloys thereof. One such copper alloy that can be used as the spacer 110 is a copper-molybdenum (CuMo) alloy. The choice of whether to use pure copper or, for example, CuMo, may be made based on heat dissipation requirements for the type of chip assembly 104 coupled to the spacer 110. For example, an FRD chip assembly, designated below as 104*b*, may operate at a higher voltage or current than an IGBT chip assembly, designated below as 104*a*, and therefore may generate more heat and may need more efficient heat dissipation as provided by a spacer 110 made of pure copper. Cost may also be a factor. Pure copper can be less expensive than a copper alloy like CuMo, while providing faster heat dissipation. However, when the spacer 110 is made of pure copper, it may be more likely to cause stress damage to surrounding materials. In particular, the molding compound 112, e.g., a polymer, which is in direct contact with the spacer 110, e.g., a pure copper spacer, is vulnerable to damage from rapid expansion of the spacer 110, especially at exposed corners C of the spacer 110.

One way of relieving stress on the molding compound 112 is to replace a portion of the molding compound 112 with a material that can absorb stress, e.g., a flexible material such as a polymer or an elastomer that can conform to the chip assembly 104*b*. Alternatively, a material that can provide further thermal dissipation, e.g., additional copper, can be used. In some implementations, the replacement material can form a protective dam 114 around (e.g., in contact with) the chip assembly 104 (and/or portions thereof). In some implementations, the replacement material can form a protective dam 114 around the lower corners C of the spacer 110 that would otherwise be surrounded by the molding compound 112. Formation of the protective dam 114 can occur after attachment of the chip assembly 104 to the substrate 102, and prior to fabrication of the upper DBM structure 106 on top of the chip assembly 104. In some implementations, the protective dam 114 can be L-shaped so as to wrap around the lower corner C. The protective dam 114 can extend under the lower corner C to abut the semiconductor die 108. The height of the protective dam 114 relative to the spacer 110 can vary, as described below.

After the upper DBM structure 106 is formed on the chip assembly 104, with the protective dam 114 in place, the molding compound 112 can be injected to be disposed in (e.g., occupy) remaining spaces around the chip assembly 104. In some implementations, the molding compound 112 fills all of the remaining space around the chip assembly. In some implementations, there may be spaces, e.g., air pockets, around the chip assembly that are not completely filled with the molding compound 112. Because the protective dam 114 already occupies space around the chip assembly 104, there will be less remaining space to fill with the molding compound 112. With the addition of the protective dam 114, the injected molding compound 112 will occupy the open space around the upper part of the chip assembly 104, which does not include exposed corners C. This region is therefore less likely to form cracks than the region around the lower part of the chip assembly 104, which is surrounded by the protective dam 114.

As shown in FIG. 1, the protective dam 114 can have a first portion closer to and in contact with the semiconductor die 108, and a second portion farther away from the semiconductor die 108 and in contact with the sidewall of the spacer 110. The first portion can have a first thickness t1 less than a second thickness t2 of the second portion. The first thickness t1 of the first portion can be disposed between a bottom surface of the spacer 110 and a top surface of the substrate 102 The second thickness t2 of the second portion can be disposed between a bottom surface of the molding compound 112 and the top surface of the substrate 102.

Figure 2:
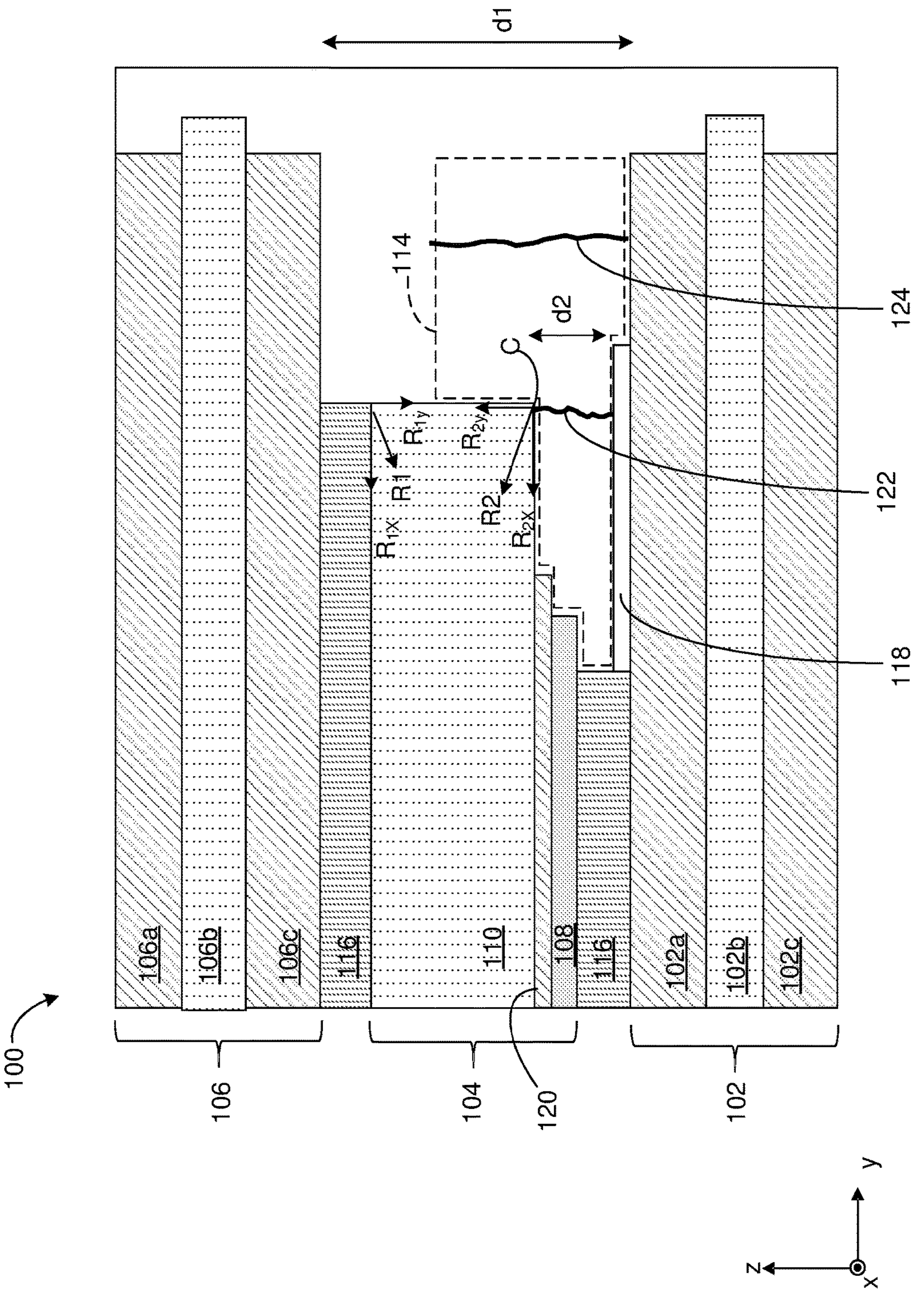
FIG. 2 is a detailed cross-sectional view of the high-power semiconductor device module shown in FIG. 1, according to an implementation of the present disclosure.

FIG. 2 shows a detailed cross-sectional view of the high-power semiconductor device module 100, according to some implementations of the present disclosure. FIG. 2 includes intermediate layers in addition to the fundamental elements shown in FIG. 1. In FIG. 2, the protective dam 114 is shown in dashed lines. In the example shown, the substrate 102 includes a lower DBM structure. In some implementations, the lower DBM structure can be substantially same as, or similar to, the upper DBM structure 106. For example, both DBM structures can be three-layer structures in which inner layers 102*b* and 106*b*, which provide the thermal mass of the DBM structures, are made of an electrically insulating but thermally conductive ceramic material, e.g., aluminum oxide ($Al_2O_3$) or another ceramic, and top and bottom outer metal layers 102*a,c* and 106*a,c* are made of copper or another high conductivity metal. In some implementations, the ceramic inner layers 102*b* and 106*b* can be attached to the outer metal layers 102*a,c* and 106*a,c* using an adhesive material (not shown), e.g., a thermally conductive epoxy adhesive, or an electrically conductive epoxy adhesive such as a silver-filled epoxy. In some implementations, the ceramic inner layers 102*b*, 106*b* can each have a thickness in a range of about 0.3 mm to about 0.35 mm. In some implementations, the outer metal layers 102*a,c* and 106*a,c* can have a thickness between about 0.2 mm and about 0.8 mm.

In some implementations, the chip assembly 104 can be attached to the upper DBM structure 106 and to the substrate 102 by solder layers 116. In forming the solder layer 116 on a top surface of the substrate 102, a solder resist material 118 can be patterned to contain solder to desired areas of the substrate 102. In some implementations, the solder resist material 118 can have a thickness in a range of about 0.01 to about 0.03 mm. Each chip assembly 104, including the semiconductor die 108 and the spacer 110, can be held together by a bonding layer 120. In some implementations, the bonding layer 120 can be made of a layer of sintered silver (Ag) inserted between the semiconductor die 108 and the spacer 110.

FIG. 2 further illustrates cracks that tend to form in the molding compound 112 surrounding the layers described above, when the protective dam 114 is excluded. In particular, the molding compound 112 located next to a lower corner C of the spacer 110 can be vulnerable to cracking in the absence of the protective dam 114. In the example shown in FIG. 2, a distance d1 of the molding compound between the upper DBM structure 106 and the substrate 102 can be in a range of about 2.0 to about 3.0 mm, and a distance d2 between the lower corner C of the spacer 110 and the lower DBM structure of the substrate 102 can be in a range of about 0.1 mm to about 0.5 mm. Without a protective dam 114 in place, strain on the spacer 110 can accumulate from radial forces R1 and R2 at the upper and lower corners, respectively, of the spacer 110. In some implementations, the radial force R2 can be especially problematic at the lower corner C, which may extend laterally beyond the semiconductor die 108. Stresses in the molding compound 112 arising from such strain on the spacer 110, caused by the various surrounding layers of material, can result in the formation of corner cracks 122 that extend downward from the lower corner C toward the substrate 102, as well as vertical cracks 124 that extend through a region of the molding compound 112 located between the upper and lower DBM structures.

Figure 3:
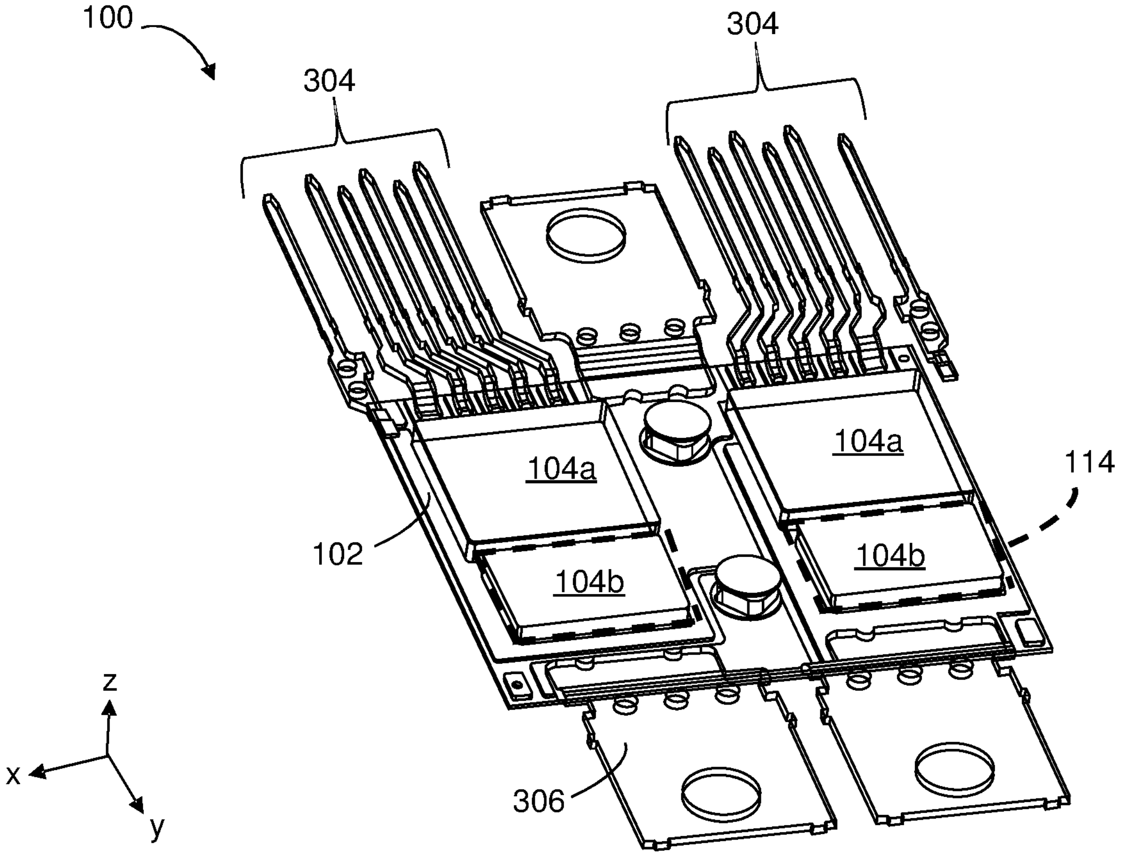
FIG. 3 is a top-side plan view of a high-power semiconductor device module attached to a lead frame, according to an implementation of the present disclosure.

FIG. 3 shows a top-down view of a packaged high-power semiconductor device module 100 attached to a lead frame, according to some implementations of the present disclosure. The lead frame includes—leads 30 and mounting brackets 306. The leads 304 (six shown on each side of the lead frame) provide signal paths to and from each semiconductor die 108 in the chip assemblies 104. The lead frame can be cut or stamped from a thin sheet of metal, e.g., copper.

In the example shown, the high-power semiconductor device module 100 includes a total of four chip assemblies that are attached to the substrate 102, e.g., to the top outer metal layer 102*a* of the lower DBM structure. The four chip assemblies shown are of two types: transistor chip assemblies 104*a* (two shown) and diode chip assemblies 104*b* (two shown). In some implementations, the larger transistor chip assemblies 104*a* contain a die 108*a* in which power transistors, e.g., IGBTs, are coupled to CuMo copper alloy spacers 110*a*. In some implementations, the smaller diode chip assembly 104*b* includes die 108*b* in which diodes, e.g., FRDs, are coupled to copper spacers 110*b*. In the example shown, the chip assemblies 104 are attached to a common substrate 102.

In FIG. 3, the protective dams 114 are represented as dashed-line rectangles. In some implementations, the protective dams can have rounded corners. In some implementations, the protective dams 114 can be square, circular, or irregularly shaped, depending on the shapes of the chip assemblies 104. In the example shown, the protective dams 114 are applied to the diode chip assemblies 104*b* that are equipped with copper spacers 110*b*, which can be more vulnerable to cracking than the transistor chip assemblies 104*a* that are equipped with copper alloy spacers 110*a*. In some implementations, a protective dam 114 can encompass more than one chip.

FIGS. 4A-4C, 5A-5C, 6A-6C, 7A-7C, and 8A-8C each show top-down, magnified, and cross-sectional views, respectively, of the packaged high-power semiconductor device module 100 with the addition of protective dams 114, according to various implementations of the present disclosure. Each set of figures shows a different example of the protective dam 114 applied to a high-power diode chip assembly 104*b* that includes, as a heat sink, the copper spacer 110*b*. It is noted that the upper DBM structures 106 have been omitted from the top-down perspective views shown in FIGS. 4A, 5A, 6A, 7A, and 8A, in the interest of clarity.

FIGS. 4A-4C and 5A-5C show the packaged high-power semiconductor device module 100 implemented with two types of flexible protective dams 114*a* and 114*b*, respectively; FIGS. 6A-6C show the packaged high-power semiconductor device module 100 implemented with a metallic protective dam 114*c*; and FIGS. 7A-7C and 8A-8C show the packaged high-power semiconductor device module 100 implemented with two types of integral protective dams 114*d* and 114*e*, respectively.

It is noted that, although each set of FIGS. 4A-4C, 5A-5C, 6A-6C, 7A-7C, and 8A-8C illustrates the protective dams 114 applied to a high-power semiconductor device module 100 implemented with dual-sided cooling provided by upper and lower three-layer DBM structures, the same protective dams 114 can be applied to a similar high-power semiconductor device module 100 implemented with single-sided cooling provided by either an upper or a lower DBM structure. Alternatively, the same protective dams 114 can be applied to a high-power semiconductor device module 100 implemented without any DBM structures.

Figure 4B:
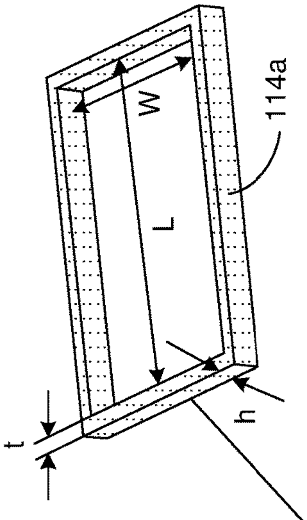
FIGS. 4A, 4B, and 4C show a top-side plan view, a magnified view, and a cross-sectional view, respectively, of a high-power semiconductor device module configured with a high profile flexible protective dam, according to an implementation of the present disclosure.
Figure 4A:
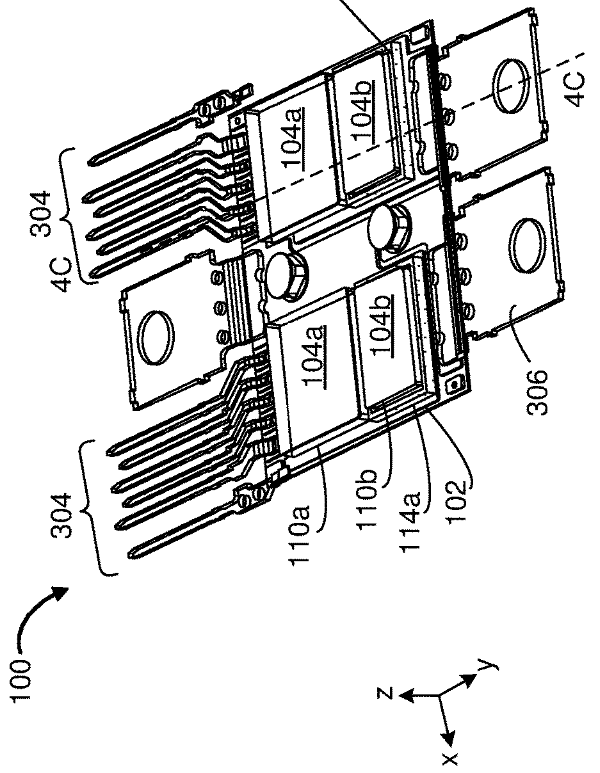
Figure 4C:
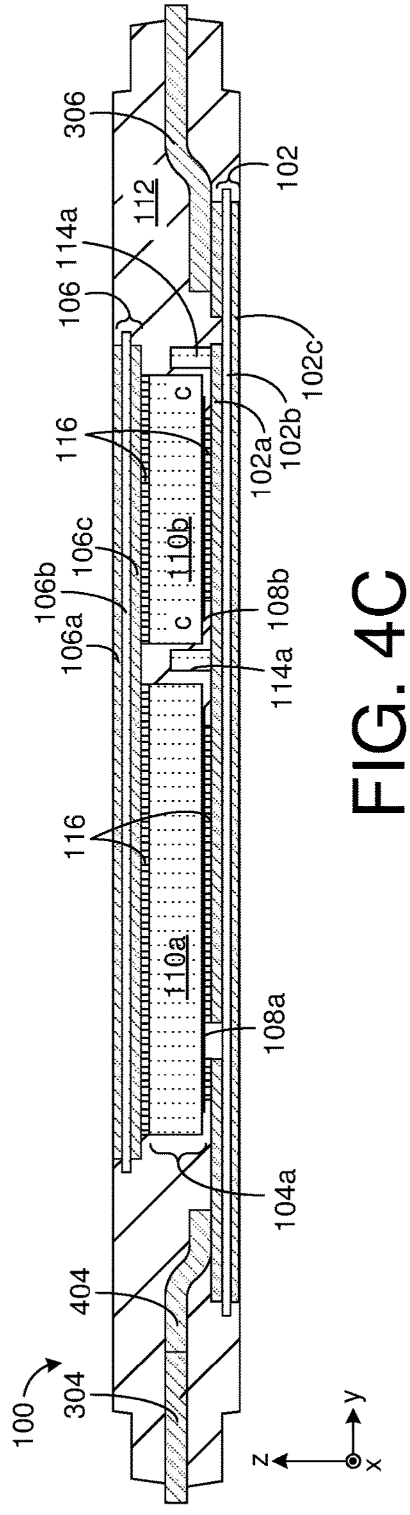

FIGS. 4A, 4B, and 4C illustrate the high-power semiconductor device module 100 configured with high profile flexible protective dams 114*a*, according to some implementations of the present disclosure. FIG. 4A shows a top-side plan view of the high-power semiconductor device module 100 during its fabrication. The high profile flexible protective dams 114*a* have been added to the FRD chip assemblies 104*b* that have copper spacers 110*b*. The high profile flexible protective dams 114*a* are not added to the IGBT transistor chip assemblies 104*a*, which have copper alloy spacers 110*a*, e.g., CuMo spacers. This is because the cracking problem as described above preferentially affects the molding compound 112 around corners of the copper spacers 110*b*, due to the higher thermal conductivity of copper.

In the example shown, the high profile flexible protective dams 114*a* are in the form of rectangular enclosures that have walls. In some implementations, the high profile flexible protective dams 114*a* are made of an elastic polymer material, similar to a gasket. In some implementations, the high profile flexible protective dams 114*a* are made of an epoxy material. The high profile flexible protective dams 114*a* may wrap and/or fit tightly around, e.g., conform to, the perimeters of each of the chip assemblies 104*b*, so that the high profile flexible protective dams 114*a* are in physical contact with the lower corners C of the copper spacers 110*b*.

FIG. 4B shows a magnified view of an example of the high profile flexible protective dam 114*a*, according to some implementations of the present disclosure. In the example shown, the dimensions of the high profile flexible protective dam 114*a* are as follows: inner length and width dimensions L and W of the high profile flexible protective dam 114*a* can be about 0.5 mm larger than the size of the spacer 110*b*; a wall thickness t of the high profile flexible protective dam 114*a* can be about 0.4 mm to about 1.0 mm; and a height h of the high profile flexible protective dam 114*a* can be in a range of about 1.0 mm to about 2.0 mm such that the high profile flexible protective dam 114*a* covers at least lower portions of the sides of the copper spacer 110*b*, as is also shown in FIG. 4C.

FIG. 4C shows a cross-sectional view of the high-power semiconductor device module 100 along cut 4C-4C, to further illustrate in detail the multi-layer DBM structures and external connections to the chip assemblies 104. In some implementations, both the lower DBM structure of substrate 102 and the upper DBM structure 106 are included as additional heat sinks to dissipate heat from both of the chip assemblies 104*a* and 104*b*, thereby providing dual-sided cooling of the high-power semiconductor device module 100. Alternatively, one of the DBM structures (e.g., DBM structure 106) can be used to provide single-sided cooling of the high-power semiconductor device module 100. In the example shown in FIG. 4C, both the upper and lower DBM structures are shared by a pair of chip assemblies 104*a* and

104*b*. In some implementations, common upper and lower DBM structures can be shared by all four of the chip assemblies included in the packaged high-power semiconductor device module 100. Alternatively, each chip assembly 104 can be attached to a separate, dedicated DBM structure or structures.

Referring still to FIG. 4C, the leads 304 provide electrical connections to the chip assemblies 104*a* and 104*b* via the top outer metal layer 102*a* of the lower DBM in the substrate 102. Some connections can be made directly to the top outer metal layer 102*a*. Other connections can be made via wire bonds 404 that couple the leads 304 to the top outer metal layer 102*a* of the lower DBM structure in the substrate 102. In some implementations, the top outer metal layer 102*a* can be patterned, while the bottom outer metal layer 102*c* can be continuous.

FIG. 4C also shows the vertical profile of the high profile flexible protective dam 114*a* relative to the sides and corners of the copper spacer 110*b*. In the example shown, the wall of the high profile flexible protective dam 114*a* surrounds the lower corners C, and extends about halfway up the sides, of the copper spacer 110*b*. In some implementations, the wall of the high profile flexible protective dam 114*a* can surround larger portions, or all, of the sides of the copper spacer 110*b*. In some implementations, the wall of the high profile flexible protective dam 114*a* can surround smaller portions, or none, of the sides of the copper spacer 110*b*. When the wall of the high profile flexible protective dam 114*a* surrounds at least some portion of the sides of the copper spacer 110*b*, the high profile flexible protective dam 114*a* forms an L-shaped profile around the lower corners C of the copper spacer 110*b*.

Figure 5B:
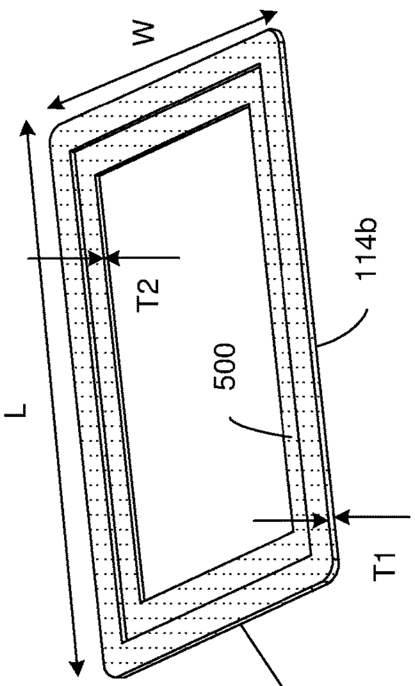
FIGS. 5A, 5B, and 5C show a top-side plan view, a magnified view, and a cross-sectional view, respectively, of a high-power semiconductor device module configured with a low profile flexible protective dam, according to an implementation of the present disclosure.
Figure 5A:
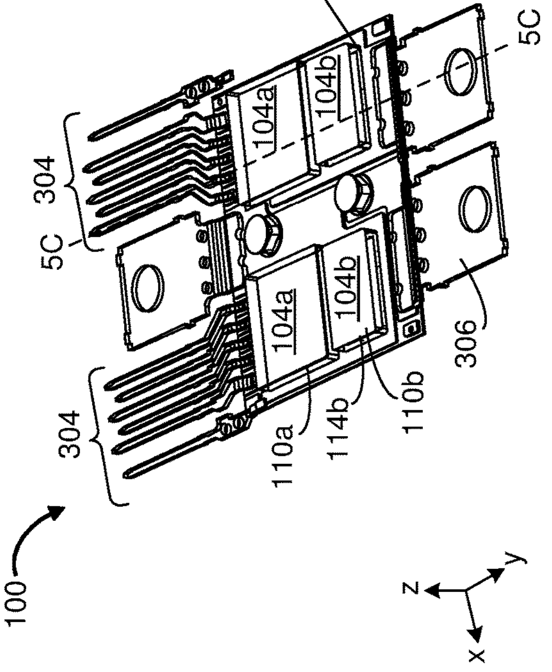
Figure 5C:
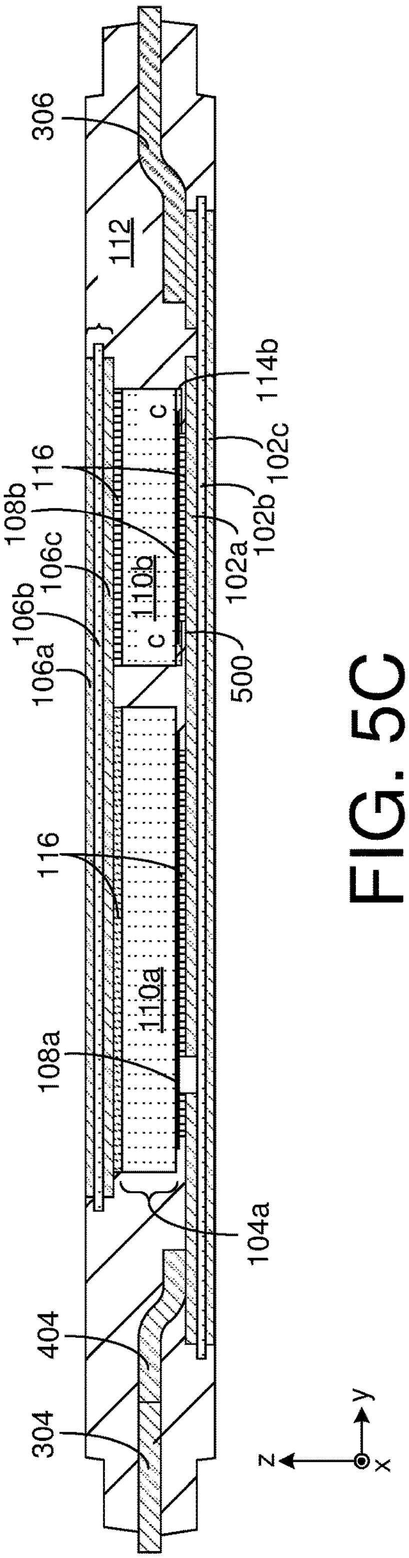
Figure 6B:
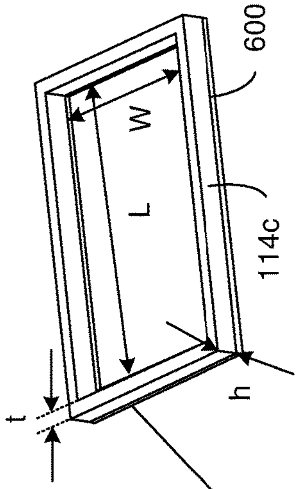
FIGS. 6A, 6B, and 6C show a top-side plan view, a magnified view, and a cross-sectional view, respectively, of a high-power semiconductor device module configured with a metallic protective dam, according to an implementation of the present disclosure.
Figure 6A:
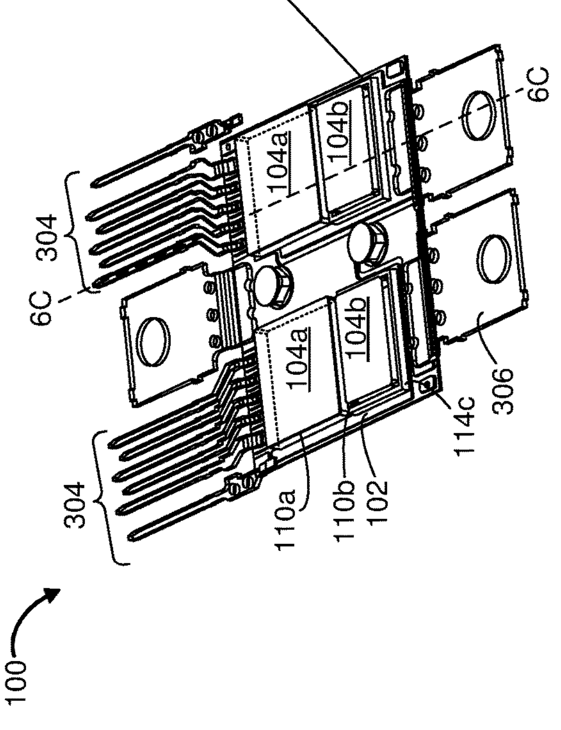
Figure 6C:
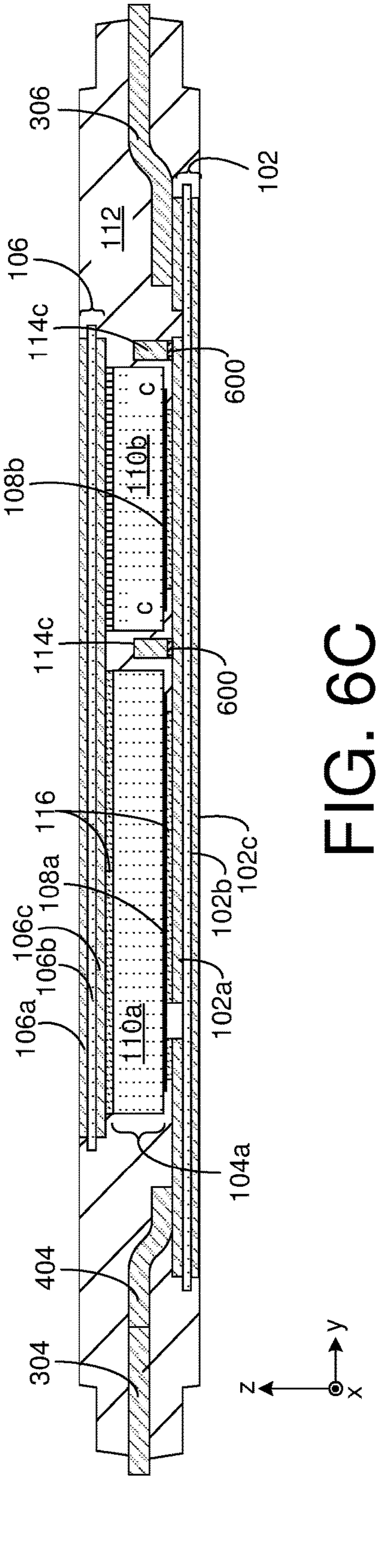

FIGS. 5A, 5B, and 5C illustrate the high-power semiconductor device module 100 configured with low profile flexible protective dams 114*b*, according to some implementations of the present disclosure. FIGS. 5A, 5B, and 5C are similar to corresponding views shown in FIGS. 4A, 4B, and 4C, except the low profile flexible protective dams 114*b* are substituted for the high profile flexible protective dams 114*a* on the FRD chip assemblies 104*b*. In the example shown, the low profile flexible protective dam 114*b* wraps around a lower perimeter of the chip assembly 104*b*, underneath the spacer 110*b*, and between the spacer 110*b* and the top outer metal layer 102*a* of the lower DBM structure in the substrate 102.

In some implementations, outer length and width dimensions L and W of the low profile flexible protective dam 114*b* can be approximately equal to the size of the spacer 110*b* such that the low profile flexible protective dam 114*b* is flush with the sides of the spacer 110*b* and extends out to, but not around, the lower corner C of the spacer 110*b*; in some implementations, the low profile flexible protective dam 114*b* can have a thickness Tl in a range of about −0.2 mm to about 0.3 mm, leaving a small gap in a range of about 0.1 mm to about 0.2 mm between the bottom of the low profile flexible protective dam 114*b* and the top outer metal layer 102*a*. In some implementations, the low profile flexible protective dam 114*b* can include an extension, e.g., an inner flange 500 that is integral to the flexible protective dam 114*b*. The inner flange 500 can extend inward and below the edges of the semiconductor die 108*b* attached to the underside of the spacer 110*b*. In some implementations, the inner flange 500 can have a thickness T In a range of about 0.09 mm to about 0.1 mm.

In some implementations, the low profile flexible protective dam 114*b* can be made of a similar elastic material as the high profile flexible protective dam 114*a* described above. Depending on its elasticity, the inner flange 500 can form a seal against the top surface of the substrate 102, e.g., against a die attach pad area of the substrate 102. In some implementations, such a sealed inner flange 500 may act as a barrier to block a flow of liquid, e.g., a flow of molten solder used in the assembly process. The inner flange 500 can be used together with the solder resist material 118 as an additional protection to control the flow of solder.

FIGS. 6A, 6B, and 6C illustrate the high-power semiconductor device module 100 configured with metallic protective dams 114*c*, according to some implementations of the present disclosure. FIGS. 6A, 6B, and 6C are similar to corresponding views shown above in FIGS. 4A, 4B, and 4C, except the metallic protective dams 114*c* are substituted for the high profile flexible protective dams 114*a* on the FRD chip assemblies 104*b*. In some implementations, the metallic protective dam 114*c* can be in the form of a rectangular frame that surrounds a lower perimeter of the chip assembly 104*b*. In some implementations, the metallic protective dam 114*c* can be slightly spaced apart from the spacer 110*b* to allow for metal expansion during heating, and contraction when the metallic protective dam 114*c* relaxes. The metallic protective dams 114*c* can be soldered to the top outer metal layer 102*a* of the lower DBC structure in the substrate 102 using a solder layer 600 applied to the underside of the metallic protective dam 114*c*. In some implementations, the metallic protective dams 114*c* can be made of copper or another high conductivity metal that can provide additional heat dissipation to draw heat away from the copper spacer 110*b* and conduct the heat through the solder layer 600, into the thermal mass of the lower DBM. The metallic protective dams 114*c* may also be resilient so as to relieve mechanical stress from around the lower corners C of the copper spacer 110*b* and prevent cracking in similar fashion as the flexible protective dams 114*a* provide stress relief.

FIG. 6B shows a magnified view of an example of a metallic protective dam 114*c*, according to some implementations of the present disclosure. In the example shown, the dimensions of the metallic protective dam 114*c* can be as follows: inner length and width dimensions L and W of the metallic protective dam 114*c* can be about 0.5 mm larger than the size of the spacer 110*b*; a wall thickness t of the metallic protective dam 114*c* can be in a range of about 0.7 mm to about 0.8 mm; a thickness of the solder layer 600 can be in a range of about 0.2 mm to about 0.3 mm; and a height h of the metallic protective dam 114*c* can be in a range of about 1.2 mm to about 1.3 mm such that the metallic protective dam 114*c* covers at least lower portions of the sides of the copper spacer 110*b*, as is also shown in FIG. 6C. In some implementations, the metallic protective dam 114*c* can surround larger portions, or all, of the sides of the copper spacer 110*b*.

FIG. 6C shows a cross-sectional view of the metallic protective dam 114*c* applied to the high-power semiconductor device module 100, according to some implementations of the present disclosure. FIG. 6C shows the profile of the metallic protective dam 114*c* is vertical, not L-shaped, and therefore it does not extend underneath the lower surface of the copper spacer 110*b*.

FIGS. 7A, 7B, and 7C illustrate the high-power semiconductor device module 100 configured with integral protective dams 114*d*, according to some implementations of the present disclosure. FIGS. 7A, 7B, and 7C are similar to corresponding views shown above, except the integral protective dams 114 are substituted for the previous types of protective dams 114 around each of the FRD chip assemblies 104*b*. In some implementations, the integral protective dam 114*d* can be in the form of a rectangular frame that surrounds a lower perimeter of the chip assembly 104*b* and can be slightly spaced apart, laterally, from the spacer 110*b*. The integral protective dam 114*d* can be integral to the top outer metal layer 102*a* of the lower DBC structure in the substrate 102. The integral protective dam 114*d* can be adjacent to a die attach pad (DAP) onto which the neighboring chip assembly 104*a* is placed. In some implementations, the integral protective dam 114*d* can be formed by etching the top outer metal layer 102*a*, prior to attaching the chip assembly 104*a*, so that the integral protective dam 114*d* extends vertically upward, in the z-direction, above the plane of the top outer metal layer 102*a*. Because the integral protective dam 114*d* is made of the same material as the top outer metal layer 102*a* from which it is formed, e.g., copper or another high conductivity metal, the integral protective dam 114*d* provides additional heat dissipation to draw heat away from the copper spacer 110*b* and to conduct the heat directly into the thermal mass of the lower DBM. The integral protective dam 114*d* may also be resilient so as to relieve mechanical stress from around the lower corners C of the copper spacer 110*b* and prevent cracking in similar fashion as the flexible protective dams 114*a* and 114*b*, and/or the metallic protective dam 114*c* provide stress relief.

FIG. 7B shows a magnified view of an example of an integral protective dam 114*d*, according to some implementations of the present disclosure. In the example shown, the dimensions of the integral protective dam 114*d* can be as follows: inner length and width dimensions L and W of the integral protective dam 114*d* can be about 0.5 mm larger than the size of the spacer 110*b*; a wall thickness t of the integral protective dam 114*d* can be in a range of about 0.5 mm to about 1.0 mm; and a height h of the integral protective dam 114*d* can be in a range of about 1.0 to about 2.0 mm such that the integral protective dam 114*d* covers at least lower portions of the sides of the copper spacer 110*b*, as is also shown in FIG. 7C. In some implementations, the integral protective dam 114*d* can surround larger portions, or all, of the sides of the copper spacer 110*b*.

FIG. 7C shows a cross-sectional view of the integral protective dam 114*d* applied to the high-power semiconductor device module 100, according to some implementations of the present disclosure. FIG. 7C shows that the profile of the integral protective dam 114*d* is a vertical extension of the underlying top outer metal layer 102*a* of the lower DBM structure. FIG. 7C further illustrates that the chip assembly 104*b* is disposed inside the integral protective dam 114*d*, while the chip assembly 104*a* is disposed outside the integral protective dam 114*d*. The profile of the integral protective dam 114*d* is not L-shaped, and therefore it does not extend underneath the lower surface of the copper spacer 110*b*.

Figure 8B:
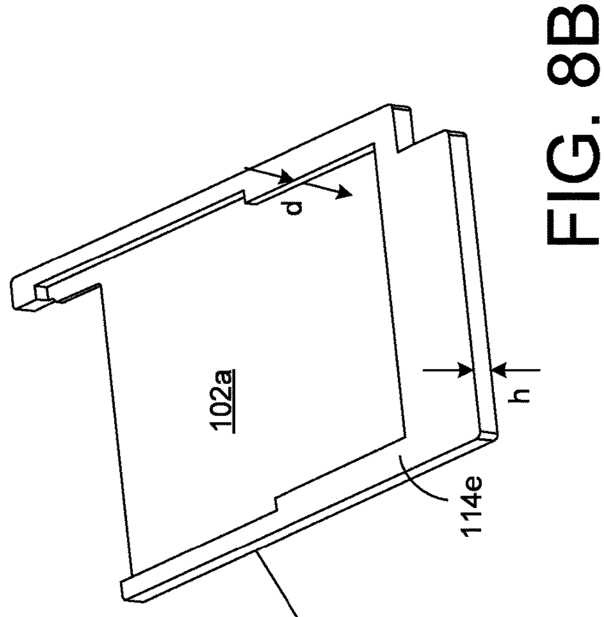
FIGS. 8A, 8B, and 8C show a top-side plan view, a magnified view, and a cross-sectional view, respectively, of a high-power semiconductor device module configured with an integral protective dam, according to an implementation of the present disclosure.
Figure 8A:
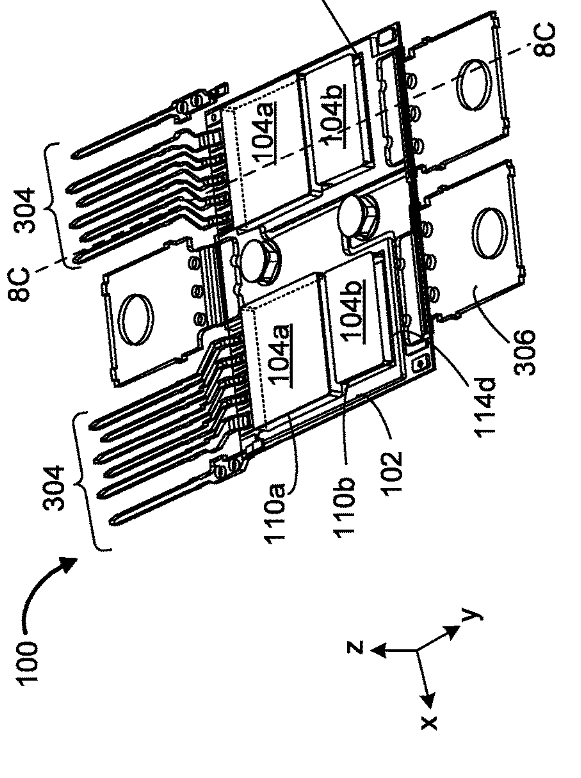
Figure 8C:
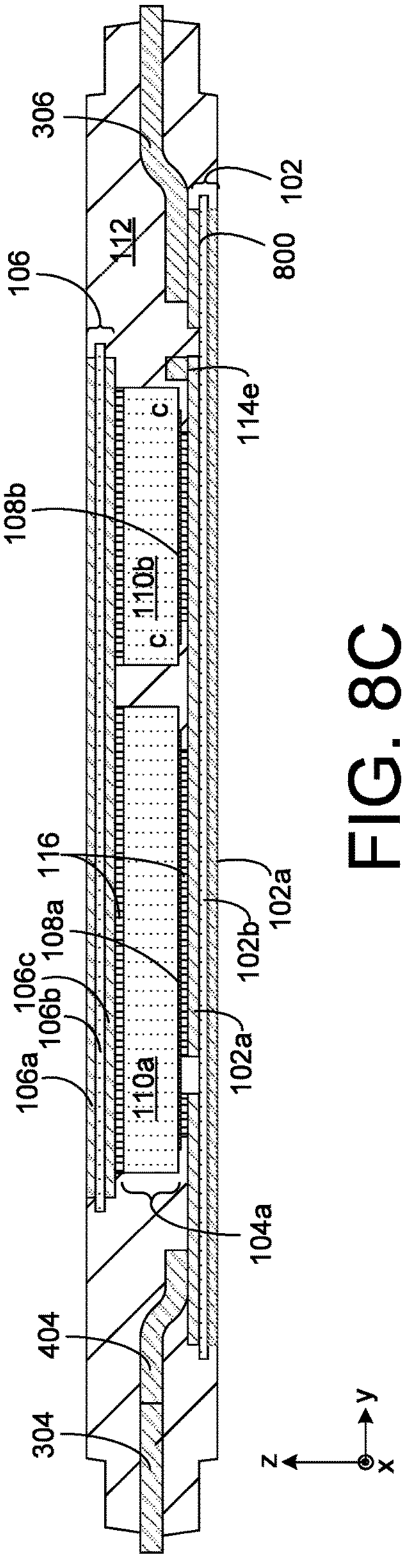

FIGS. 8A, 8B, and 8C illustrate the high-power semiconductor device module 100 configured with integral protective dams 114*e*, according to some implementations of the present disclosure. FIGS. 8A, 8B, and 8C are similar to corresponding views shown above, except the integral protective dams 114*e* are substituted for the previous types of protective dams 114 around the FRD chip assemblies 104*b*. In some implementations, the integral protective dams 114*e* can be in the form of a partial wall that surrounds a portion of the lower perimeter of the chip assembly 104*b* and can be slightly spaced apart, laterally, from the copper spacer 110*b*. The integral protective dams 114*e* can be integral to the top outer metal layer 102*a* of the lower DBC structure in the substrate, formed by etching a recess in the top outer metal layer 102*a*, prior to attaching the chip assembly 104*a*, so that the integral protective dams 114*e* extend vertically upward, in the z-direction, above the plane of the top outer metal layer 102*a*. Because the integral protective dam 114*e* is made of the same material as the top outer metal layer 102*a* from which it is formed, e.g., copper or another high conductivity metal, the integral protective dam 114*e* provides additional heat dissipation to draw heat away from the copper spacer 110*b* and to conduct the heat directly into the thermal mass of the lower DBM. The integral protective dam 114*e* may also be resilient so as to relieve mechanical stress from around the lower corners C of the copper spacer 110*b* and prevent cracking in similar fashion as the flexible protective dams 114*a* and 114*b*, and/or the metallic protective dams 114*c* provide stress relief.

FIG. 8B shows a magnified view of an example of an integral protective dam 114*e*, according to some implementations of the present disclosure. In the example shown, the dimensions of the integral protective dam 114*e* can be as follows: inner length and width dimensions L and W of the recess forming the integral protective dam 114*e* can be about 0.5 mm larger than the size of the spacer 110*b*; a recess depth d of the recess forming the integral protective dam 114*e* can be in a range of about 0.5 mm to about 1.0 mm; and a total height h of the copper top outer metal layer 102*a* can be in a range of about 1.0 mm to about 1.5 mm such that the integral protective dam 114*e* covers at least the bottom corners C of the copper spacer 110*b*, as is also shown in FIG. 8C. In some implementations, a deeper recess can be etched in the copper top outer metal layer 102*a* so that the integral protective dam 114*e* can surround larger portions, or all, of the sides of the copper spacer 110*b*.

FIG. 8C shows a cross-sectional view of the integral protective dam 114*e* applied to the high-power semiconductor device module 100, according to some implementations of the present disclosure. FIG. 8C shows that the profile of the integral protective dam 114*e* is an asymmetric vertical extension of the underlying top outer metal layer 102*a* of the lower DBM structure. That is, unlike the integral protective dam 114*d*, the integral protective dam 114*e* does not necessarily surround the copper spacer 110*b* on all sides. For example, as shown in FIG. 8B, the integral protective dam 114*e* surrounds the copper spacer 110*b* on three sides. However, in some implementations, the recess formed in the top outer metal layer 102*a* can be symmetric so that the integral protective dam 114*e* does surround the copper spacer 110*b* on all sides. Further, unlike the implementations described above, the recess formed in the upper layer 102*a* that defines the integral protective dam 114*e* encompasses both of the chip assemblies 104*a* and 104*b*, not just the diode chip assembly 104*b*. The profile of the integral protective dam 114*e* is not L-shaped, and therefore it does not extend underneath the lower surface of the copper spacer 110*b*.

Figure 9:
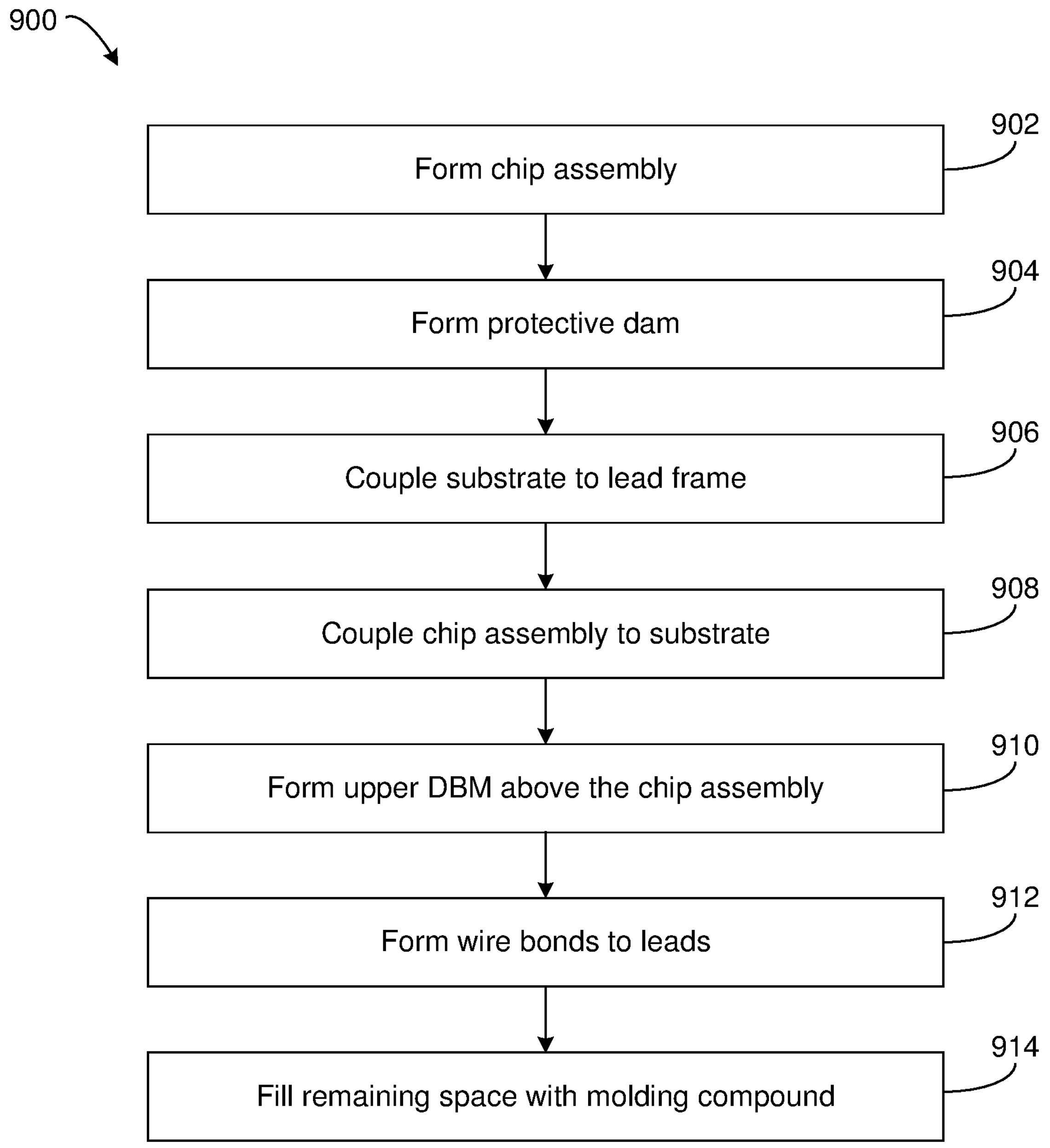
FIG. 9 is a flow diagram of a method for fabricating a high-power semiconductor device module configured with a protection dam, according to an implementation of the present disclosure.

FIG. 9 is a flow chart illustrating a method 900 for fabricating the high-power semiconductor device module 100, according to some implementations of the present disclosure. Operations of method 900 can be performed in a different order, or not performed, depending on specific applications. It is noted that method 900 may not produce a complete high-power semiconductor device module 100. Accordingly, it is understood that additional processes can be provided before, during, or after method 900, and that some of these additional processes may be briefly described herein. The operations 902-910 can be carried out to form high-power semiconductor device modules 100 and to apply protective dams 114*a*, 114*b*, 114*c*, 114*d*, or 114*e* according to the implementations described above.

At 902, the method 900 includes forming the chip assemblies 104 by coupling a semiconductor die to a heat sink for each chip assembly 104. For example, transistor chip assemblies 104*a* can be fabricated by coupling a copper alloy spacer 110*a* to each IGBT semiconductor die 108*a*; and diode chip assemblies 104*b* can be fabricated by coupling a copper spacer 110*b* to each FRD semiconductor die 108*b*.

At 904, the method 900 includes forming the protective dam 114. When flexible protective dams 114*a* or 114*b* are used, operation 904 can include fabricating the flexible protective dam 114 separately and then stretching the flexible protective dam 114 around the diode chip assembly 104*b*. When a metallic protective dam 114*c* is used, operation 904 can include soldering the metallic dam 114*c* onto the substrate 102. When an integral protective dam 114*d* is used, operation 904 can include etching the top surface of the substrate 102, e.g., a thick top outer metal layer 102*a*, to remove a layer of metal, so as to leave behind the walled structure of the integral protective dam 114*d*. When an integral protective dam 114*e* is used, operation 904 can include etching a recess in the top surface of the substrate 102, e.g., top outer metal layer 102*a*, to create a recessed copper layer, thereby leaving behind the structure of the integral protective dam 114*d*.

At 906, the method 900 includes coupling the substrate 102 to the the lead frame In some implementations, the substrate 102 can be a three-layer DBM, and the top outer metal layer 102*a* can be coupled to the leads 304 and mounting brackets 306

At 908, the method 900 includes coupling the chip assemblies 104*a* and 104*b* to the substrate 102. In some implementations, the chip assemblies 104 can be coupled to the substrate 102 by the solder layer 116, using a soldering reflow process, a sintering process, or other appropriate process. In some implementations, attaching the chip assemblies 104 to the substrate 102 can be accomplished by mounting, or bonding, the chip assemblies 104 to the substrate 102, e.g., using a bonding adhesive, e.g., a conductive bonding adhesive in place of the solder layer 116. In some implementations, attaching the chip assembly 104*b* with the flexible protective dam 114*b* to the substrate 102 includes applying pressure to form a seal between the flange 500 and the substrate 102.

At 910, the method 900 includes forming the upper DBM 106 over the chip assembly 104. In some implementations, the upper DBM 106 is formed separately and is attached with solder layer 116 to the chip assemblies 104 using a soldering reflow process, a sintering process, or other appropriate process. In some implementations, attaching the upper DBM 106 to the chip assemblies 104 can be accomplished by mounting, or bonding, upper DBM 106 to the chip assemblies 104, e.g., using a bonding adhesive, e.g., a conductive bonding adhesive in place of the solder layer 116. The operation 910 can be omitted when single-sided cooling is used.

At 912, the method 900 includes forming wire bonds 404 to connect the substrate 102 to leads 304. A lower end of the wire bond 404 can be soldered to bond pads formed in the substrate 102, e.g., in the top outer metal layer 102*a*. An upper end of the wire bond 404 can be soldered to a selected one of leads 304, in accordance with a prescribed circuit design. Brackets 306 can be attached to the substrate 102 at structural connection points 800 at the same time as the wire bond 404 connections are made.

At 914, the method 900 includes encapsulating the high-power semiconductor device module 100 with the molding compound 112 using, for example, an injection molding process. The encapsulation introduces the molding compound 112 into remaining spaces between and around the chip assemblies 104 that are not occupied by electronic components, connections, or the protective dams 114. In some implementations, the upper and lower DBMs define the top and bottom surfaces of the package such that the molding compound 112 does not surround the upper and lower DBMs. External connections can then be made to the r top outer metal layers 106*a* and 102*a*.

Figure 10:
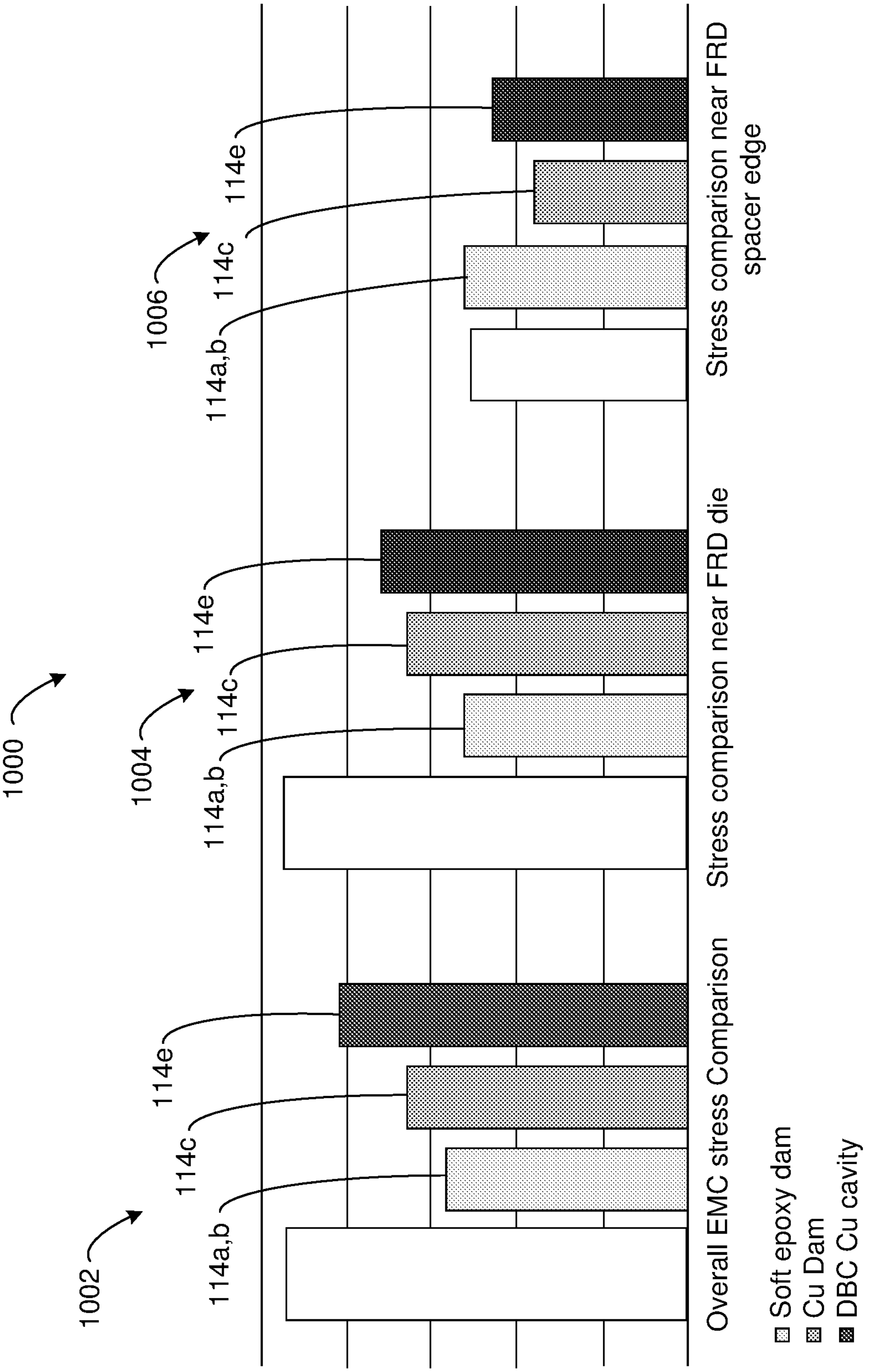
FIG. 10 is a plot of computer simulation data showing the benefits of implementing various types of protective dams, according to an implementation of the present disclosure.

FIG. 10 shows computer simulation results 1000 of tensile stress reduction in the molding compound 112, according to some implementations of the present disclosure. The tensile stress reduction is observed when the protective dams 114 are applied to the high-power semiconductor device module 100.

Computer simulations were run on a model of the high-power semiconductor device module 100, to compare calculated stresses at different representative locations of the molding compound 112 for different implementations of the protective dam 114. The results are compared with a high-power semiconductor device module 100 implemented without a protective dam 114. A first data set 1002 is calculated as an overall representation of stress in the molding compound 112; a second data set 1004 is calculated at a representative location in the vicinity of the FRD diode chip assembly 104*b*; a third data set 1006 is calculated at a representative location near the edge of the spacer 110*b* of the FRD diode chip assembly 104*b*; and. The different implementations of the protective dam 114 that were simulated include a soft epoxy version of the flexible protective dam 114*a*, 114*b* an enclosed copper protective dam 114*c*, 114*d*, and a copper protective dam 114*e* formed by etching a recess in the top outer metal layer 102*a*.

Referring still to FIG. 10, the computer simulations of tensile stress within the molding compound 112, or "EMC tensile stress" show a performance improvement with use of the each of the simulated protective dams 114. The best overall protection, indicated by the first data set 1002, was shown to be associated with the flexible protective dams 114*a*/114*b*. In particular, EMC tensile stress can be reduced by about 33.5%, for flexible protective dams having the dimensions specified above, when the flexible protective dams 114*a* and 114*b* are made of a soft epoxy material. The computer simulations further indicate that EMC tensile stress can be reduced by about 22.4% using the enclosed copper protective dams 114*c*/114*d* regardless of whether the copper protective dam is soldered in place or formed by etching a wall in the copper top outer metal layer 102*a*. The computer simulations further indicate that EMC tensile stress can be reduced by about 4.2% using an integral protective dam 114*e* that is formed by etching a recess in the copper top outer metal layer 102*a* having a recess depth in a range of about 0.5 mm to about 1.0 mm. Results for the second data set 1004 are similar to those for the first data set 1002.

Referring to the third data set, 1006, near the FRD spacer edge, the best protection, as predicted by the models, can be achieved by using the copper dams 114*c*/114*d*, which shows about a 22.7% reduction in EMC stress, compared with about a 10.7% increase in stress with the flexible protective dams 114*a*/114*b* and about a 2.8% reduction in stress with the use of the recess-etched integral protective dam 114*e*. In these cases, the EMC stress does not exceed the strength of the EMC near the FRD spacer edge.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
- a substrate;
- a chip assembly coupled to the substrate, the chip assembly including:
  - a semiconductor die, and
  - a heat sink coupled to the semiconductor die;
- a protection dam surrounding at least a portion of a perimeter of the chip assembly, the protection dam having an inner side facing at least a portion of a sidewall of the heat sink; and
- a molding material coupled to the heat sink and to at least an outer side of the protection dam, the outer side being opposite the inner side.

2. The apparatus of claim 1, wherein the protection dam includes a barrier configured to block a flow of solder.

3. The apparatus of claim 1, wherein the protection dam forms a seal against the substrate.

4. The apparatus of claim 1, wherein the chip assembly is a first chip assembly, and further comprising a second chip assembly coupled to the substrate, wherein the protection dam encompasses both chip assemblies.

5. The apparatus of claim 1, wherein the chip assembly is a first chip assembly, the apparatus further comprising a second chip assembly coupled to the substrate, the second chip assembly being disposed outside the protection dam.

6. The apparatus of claim 1, wherein the protection dam includes an elastic material configured to absorb mechanical stress in response to expansion of the heat sink.

7. The apparatus of claim 1, wherein the protection dam includes a portion extending between a bottom side of the heat sink and the substrate.

8. The apparatus of claim 1, wherein the protection dam contacts the sidewall of the heat sink.

9. The apparatus of claim 7, wherein the portion contacts a side of the semiconductor die and the sidewall of the heat sink.

10. An apparatus, comprising:
- a substrate, wherein the substrate includes a metal layer;
- a die assembly coupled to the substrate, the die assembly including a spacer and a semiconductor die; and
- a protection dam disposed on the substrate around the semiconductor die and around at least a portion of the spacer; wherein the protection dam is defined by a recessed portion of a surface of the metal layer, and wherein the die assembly is coupled to the recessed portion of the surface of the metal layer.

11. The apparatus of claim 10, wherein the substrate is a direct bonded metal (DBM) substrate, including a first metal layer, a second metal layer, and an insulating layer disposed between the first metal layer and the second metal layer, the protection dam defined by a recessed portion of the first metal layer.

12. The apparatus of claim 10, wherein the substrate is a direct bond metal (DBM) substrate.

13. The apparatus of claim 10, wherein the protection dam is integrated into the substrate.

14. The apparatus of claim 10, wherein the protection dam includes an extension configured as a solder barrier.

15. The apparatus of claim 10, wherein a height of the protection dam is greater than a distance between the substrate and a bottom surface of the spacer.

16. The apparatus of claim 10, wherein the protection dam includes an inner side facing the semiconductor die and at least a portion of the spacer, and an outer side opposite the inner side, the apparatus further comprising:
- molding material in contact with the spacer, the inner side of the protection dam, and the outer side of the protection dam.

17. The apparatus of claim 10, wherein the spacer includes copper.

18. A method, comprising:
- forming a chip assembly that includes a semiconductor die attached to a metal spacer;
- coupling a protective dam to the chip assembly prior to coupling the chip assembly to a substrate, wherein the protective dam is flexible and disposed around and in contact with the semiconductor die and at least a portion of the spacer;
- coupling the chip assembly and protective dam to the substrate;
- forming a direct bond metal (DBM) layer above the chip assembly; and
- filling remaining space around the chip assembly with a molding compound.

19. The method of claim 18, wherein the protective dam is stretched around the chip assembly prior to coupling the chip assembly to the substrate.

20. The method of claim 18, wherein coupling the protective dam to the substrate includes applying an adhesive.

21. The method of claim 18, wherein the protective dam includes an elastic material configured to absorb mechanical stress in response to expansion of the metal spacer.

22. The method of claim 21, wherein the protective dam comprises a first portion disposed along a lateral side of the spacer and a second portion extending between a bottom side of the spacer and the substrate.

23. A method, comprising:

fabricating a chip assembly that includes a semiconductor die and a copper spacer;

removing a portion of a metal layer of a substrate to form a protective dam and a recessed surface of the metal layer that is surrounded by the protective dam;

coupling the semiconductor die of the chip assembly to the recessed surface of the metal layer;

forming a direct bond metal (DBM) layer above the chip assembly; and filling remaining space around the chip assembly with a molding compound.

24. The method of claim 23, further comprising coupling additional chip assemblies to the substrate, and wherein removing the portion of the metal layer forms a protective dam around at least one of the additional chip assemblies.

* * * * *